United States Patent
Lee et al.

(10) Patent No.: US 6,469,386 B1
(45) Date of Patent: Oct. 22, 2002

(54) LEAD FRAME AND METHOD FOR PLATING THE SAME

(75) Inventors: Kyu-han Lee, Changwon; Sang-hun Lee, Jeonju; Sung-il Kang; Se-chul Park, both of Changwon, all of (KR)

(73) Assignee: Samsung Aerospace Industries, Ltd., Kyongsangnam-do (KR)

( * ) Notice: Subject to any disclaimer, the term of this patent is extended or adjusted under 35 U.S.C. 154(b) by 0 days.

(21) Appl. No.: 09/492,402

(22) Filed: Jan. 27, 2000

(30) Foreign Application Priority Data

Oct. 1, 1999 (KR) ............................................. 99-42306
Oct. 1, 1999 (KR) ............................................. 99-42322

(51) Int. Cl.⁷ ............................................. H01L 23/48
(52) U.S. Cl. ........................ 257/748; 257/666; 257/677
(58) Field of Search ................................. 257/677, 676, 257/666, 748

(56) References Cited

U.S. PATENT DOCUMENTS

| | | | | |
|---|---|---|---|---|
| 5,767,574 A | * | 6/1998 | Kim et al. .................. | 257/677 |
| 5,801,436 A | * | 9/1998 | Seriza ........................ | 257/677 |
| 5,958,607 A | * | 9/1999 | Kim et al. .................. | 428/675 |
| 5,977,620 A | * | 11/1999 | Kim et al. .................. | 257/677 |
| 5,994,767 A | * | 11/1999 | Huang et al. ............... | 257/666 |
| 6,087,714 A | * | 7/2000 | Kubara et al. .............. | 257/666 |
| 6,150,711 A | * | 11/2000 | Kom et al. ................. | 257/677 |
| 6,150,713 A | * | 11/2000 | Park et al. .................. | 257/677 |

FOREIGN PATENT DOCUMENTS

JP            1501723         9/1984

* cited by examiner

Primary Examiner—David L. Talbott
Assistant Examiner—Lourdes Cruz
(74) Attorney, Agent, or Firm—Finnegan, Henderson, Farabow, Garrett & Dunner LLP

(57) ABSTRACT

A lead frame for a semiconductor package and a method for manufacturing the lead frame. In the manufacture of the lead frame, a protective layer is formed with nickel (Ni) or Ni alloy on a metal substrate, an intermediate layer is then formed with palladium (Pd) or Pd alloy on the protective layer. Then, Pd and gold (Au) are alternately plated on the surface of the intermediate layer to form an outermost layer including both Pd and Au particles thereon.

7 Claims, 5 Drawing Sheets

LEAD FRAME AND METHOD FOR PLATING THE SAME

BACKGROUND OF THE INVENTION

1. Field of the Invention

The present invention relates to a lead frame for semiconductor packages and a method for plating the lead frame, and more particularly, to a pre-plated lead frame having an improved outermost plated layer over a metal substrate and a method for plating the lead frame.

2. Description of the Related Art

Lead frames, which form a semiconductor package together with a semiconductor chip, serve to support the semiconductor chip in the package in addition to electrically connecting the chip to an external circuit.

An example of a lead frame is shown in FIG. 1. As shown in FIG. 1, the lead frame 10 includes a pad 11, an inner lead 12 and an outer lead 13 The lead frame 10 is usually manufactured by stamping or etching.

FIG. 2 shows an example of a semiconductor package. As shown in FIG. 2, a semiconductor chip 15, which is mounted on the pad 11, is connected to the inner lead 12 by wire bonding. The outer lead 13 is electrically connected to an external circuit. The chip 15 and the inner lead 12 are molded with a resin 14, so that a semiconductor package 16 is completed.

In the manufacture of such a semiconductor package, edges of the pad 11 and inner lead 12 are plated with a metal such as silver (Ag) so as to improve the wire bonding properties between the chip 15 and the inner lead 12, and the characteristics of the pad 11. Also, for an improved solderability in mounting a semiconductor package onto a printed circuit board (PCB), solder containing tin (Sn) and lead (Pb) is deposited on a predetermined area of the outer lead 12. However, the plating and the soldering are carried out by wet processes after the molding with resin, so that the reliability problem rises.

To avoid this problem, use of a pre-plated frame has been suggested. According to the pre-plating technique, prior to semiconductor package process, plated layers are formed with a material having good solder wettability on a lead frame.

FIG. 3 shows an example of a lead frames manufactured by the conventional pre-plating technique. The conventional lead frame 20 shown in FIG. 3, which is disclosed in Japanese Patent No. 1501723, includes a nickel (Ni) plated layer 22 as an intermediate layer and a palladium (Pd) plated layer 23 as the outermost layer, which are sequentially formed on a metal substrate 21 made of copper (Cu) or copper alloy.

In the lead frame 20, the Ni plated layer 22 prevents diffusion of Cu or Fe of the metal substrate 21 up to the surface of the lead frame, by which copper oxide or copper sulfide are produced on the frame surface. Also, the Pd outermost plated layer 23 is formed of a good solderability material to provide a protective function for the surface of the nickel plate layer 22.

In the manufacture of the lead frame 20, a pre-treatment is carried out before plating. However, in the case where the surface of the metal substrate 21 has defects, due to a higher energy level in the defect region than in the other region having no defects, Ni plating for the Ni plated layer proceeds faster in the defect region than in the other region, resulting in a rough surface of the plated layer due to a decreased coherence with the other region. Especially, in the case where Pd is plated on the surface of the Ni plated layer formed on the defect region by electroplating, a large amount of hydrogen bubbles effervescing in electrolyte, are incorporated into the Pd plated layer during the plating with Pd. This is because the Pd deposition potential is similar to the hydrogen deposition potential. Accordingly, perforations due to the hydrogen bubbles are present boosting the defect problems with the Pd plated layer. Such defects in the Pd plated layer causes oxidation of the Ni plate layer, in addition to deteriorating the wire bonding and solderability properties. Besides such defects, a thermal process for semiconductor manufacture may cause interlayer diffusion in the lead frame in turn the solderability problems. Also, the surface of the Pd outermost plated layer can be oxidized by the thermal process, thereby deteriorating the inherent good solderability of palladium.

Another example of a lead frame manufactured by the pre-plating technique, which has been suggested so as to solve the above problems, is shown in FIG. 4. The lead frame 20' shown in FIG. 4 further comprises a thin film 24 formed of gold (Au) on the Pd plated layer 23 compared to the lead frame 20 in FIG. 2. In the disclosure, Au having good oxidation resistance is used to plate the Pd plated layer so as to prevent oxidation of the Pd plated layer 23 with an improved solderability.

As described above, the plating of Au on the Pd plated layer is for preventing the oxidation of the Pd plated layer by the thermal process for semiconductor manufacture, thereby improving the solderability in mounting the completed package onto a PCB. In addition to the plating of Au, the topography of the Au plated layer is an important concern for improving the Au plating effects. However, a known Au plating technique is not sufficient to provide an even plated layer on the Pd plated layer. The Au plated layer is usually formed to a thickness of 0.3 microinch so as to prevent the oxidation of Pd. Unfortunately, such a thick Au plated layer brings an adverse impact into molding with EMC resin for semiconductor assembly, and particularly, in view of adhesion between the Au outermost plated layer of the lead frame and the molding resin. In molding with EMC resin, the EMS resin has a low affinity for a pure metal or alloy. Also, because Au has a greater oxidation resistance than Pd, the adhesion of the EMC mold to the Au plated layer is further decreased, causing mold delamination failure. Also, such poor adhesion between the Au plated layer and the resin lowers the reliability of the product.

In another aspect, forming such a thick Au plated layer is undesirable in view of costs. Also, the Au plate layer, which is formed as an anti-oxidation layer for Pd, relatively decreases the adhesion of a chip to a die. The Au plated layer can improve the solder wettiablity during soldering compared to a conventional lead frame. However, due to interaction between Au of the plated layer and tin (Sn) during the soldering process, the Au plated layer is easy to be broken by external impacts after being mounted on a PCB.

To account for these problems, localized plating, i.e., plating only the outer lead portion, has been suggested. However, the localized plating requires additional masks for the plating, which raises the manufacturing costs and lowers productivity. Due to this reason, the Au plate layer has been formed over the intermediate palladium plate layer so as to prevent the oxidation of the palladium plate layer, despite its costs.

U.S. Pat. No. 5,767,574 teaches a lead frame capable of eliminating the above problems, which includes a Ni alloy plated layer, a Pd strike plated layer and a Pd alloy layer which are sequentially formed on a metal substrate. Here, the outermost Pd alloy plated layer is composed of Pd and Au. The problem of the oxidation of Pd and the high cost of using Au can be eliminated by the outermost plated layer including Au. The restricted use of Au in the outermost layer improves the adhesion with resin in semiconductor packaging and minimizes the possibility of being broken after mounted on a PCB. However, when plating Au in the Pd-based outermost plate layer, it is difficult to effectively prevent the incorporation of hydrogen bubbles into the outermost layer. The presence of perforations due to hydrogen bubbles in the outermost layer deteriorates the outermost layer's protective function for the underlying Pd plated layer. In addition to, the presence of the perforations degrades the wire bonding strength and solderability of the lead frame during thermal process.

SUMMARY OF THE INVENTION

To solve the above problems, it is an object of the present invention to provide a lead frame and a method for manufacturing the same, in which the solderability, wire bonding strength, the adhesion with resin in semiconductor packaging, and a protective function for a palladium (Pd) plated layer are improved.

The above object is achieved by the method according to the present invention for manufacturing a lead frame, the method comprising: forming a protective layer with nickel (Ni) or Ni alloy on a metal substrate; forming an intermediate layer with palladium (Pd) or Pd alloy on the protective layer; and alternately plating the surface of the intermediate layer with Pd and gold (Au) at least one time to form an outermost layer including both Pd and Au particles.

Preferably, the alternate plating to form the outermost layer, either Pd or Au can be plated first on the intermediated layer.

In the outermost plate layer formation, first Pd is roughly plated at the nucleation site of the intermediate layer by applying the pulse current, and in turn Au is accumulated filling the space between accumulated Pd particles. Because the Au deposition potential is lower than that the Pd deposition potential, Au particles can be easily accumulated between the Pd particles.

According to another aspect of the present invention, there is provided a lead frame for a semiconductor package, comprising: a protective layer formed of nickel (Ni) or Ni alloy on a metal substrate; an intermediate layer formed of palladium (Pd) on the protective layer; and an outermost layer formed of Pd and gold (Au) on the Pd intermediate layer.

In another embodiment, the present invention provides a lead frame for a semiconductor package, comprising: a protective layer formed of nickel (Ni) or Ni alloy on a metal substrate; and an outermost layer formed of palladium (Pd) and gold (Au) on the protective layer.

In the formation of the intermediate layer of Pd or Pd alloy and the Au or Au alloy plated regions, high pulse current application, sputtering or vapor deposition technique is used.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
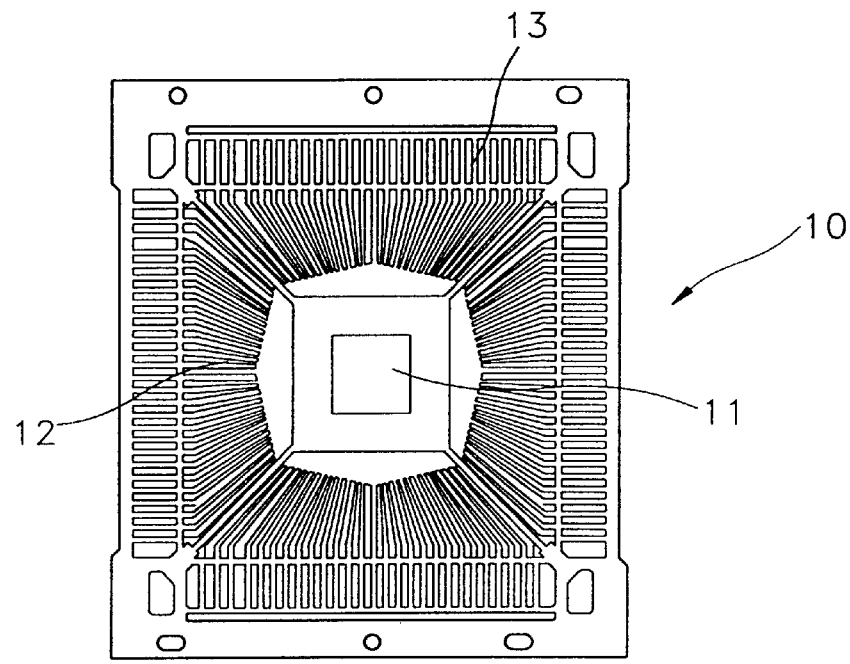
FIG. 1 is a plan view of a general lead frame.
Figure 2:
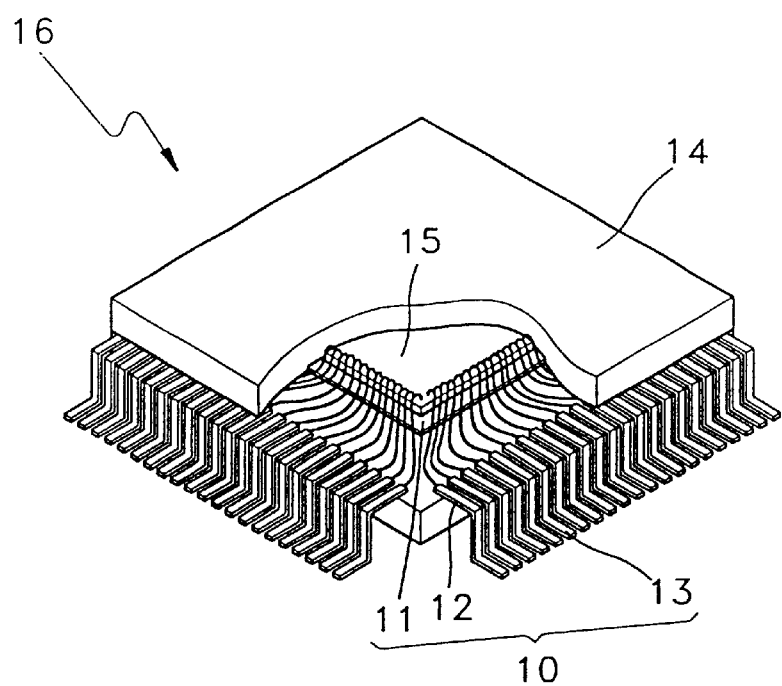
FIG. 2 is an exploded perspective view of a semiconductor package.
Figure 3:
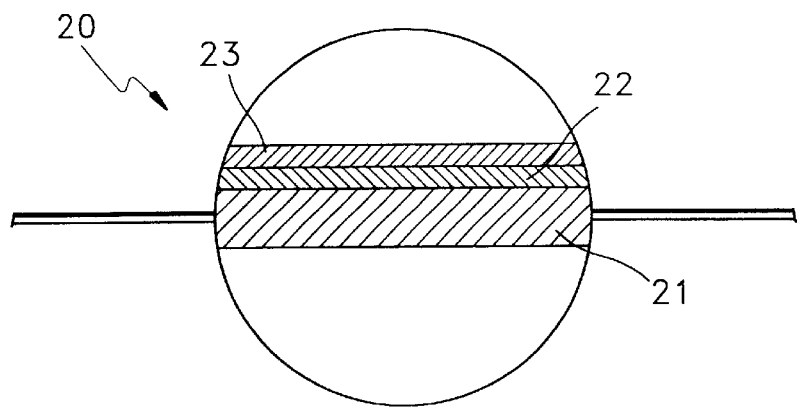
FIGS. 3 and 4 are sectional views depicting examples of a conventional lead frame.
Figure 4:
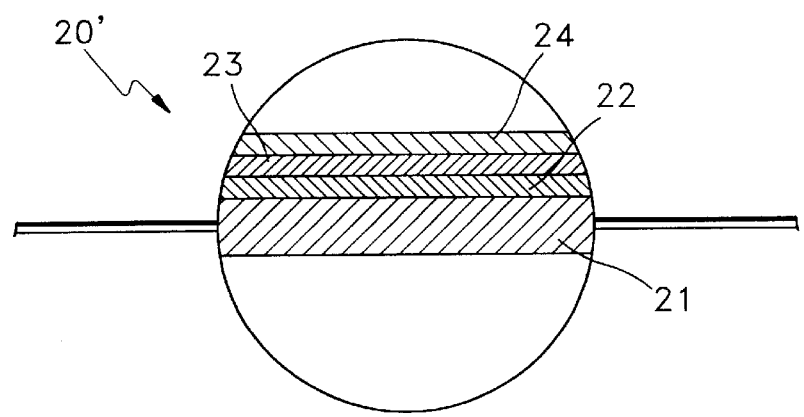
Figure 5:
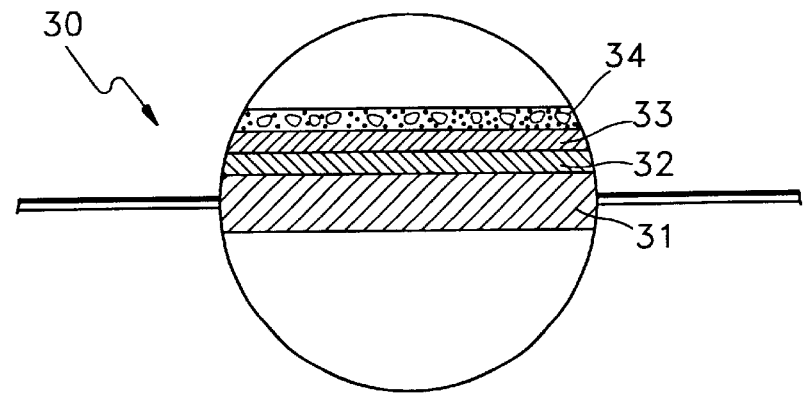
FIG. 5 is a sectional view of an embodiment of a lead frame according to the present invention.

As shown in FIG. 5, which shows an embodiment of a lead frame for a semiconductor package, the lead frame includes a metal substrate 31 formed of copper (Cu), Cu alloy or iron-nickel (Fe—Ni) alloy, a protective layer 32 formed of Ni or Ni alloy on the metal substrate 31, an intermediate layer 33 formed of palladium (Pd) or Pd alloy on the protective layer 32, and an outermost layer 34, which includes Pd and gold (Au) particles, formed on the intermediate layer 32. The outermost layer 34 may be formed by plating alternately with Pd and Au.

Figure 6:
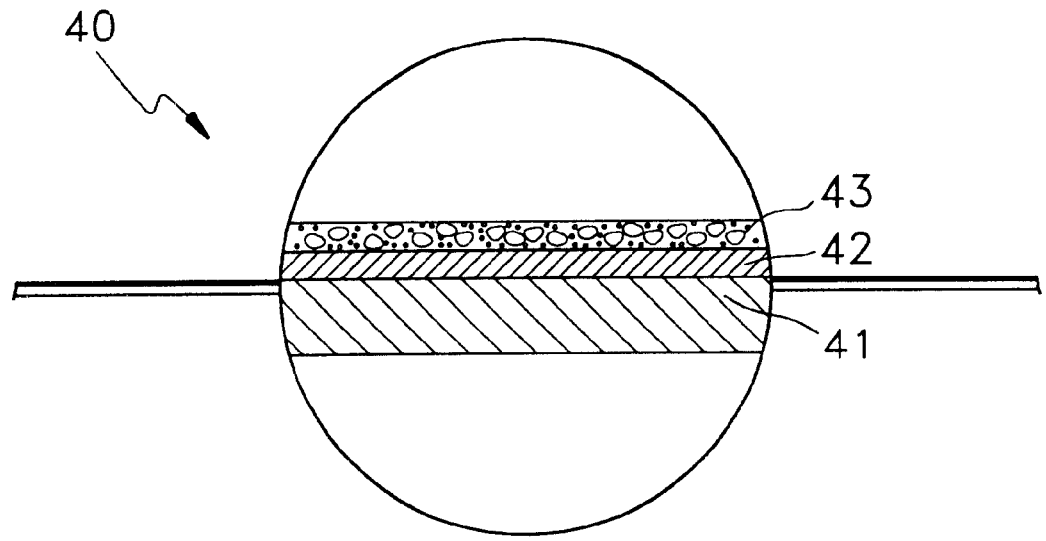
FIG. 6 is a sectional view of another embodiment of the lead frame according to the present invention.

Another example of the lead frame according to the present invention is shown in FIG. 6. The lead frame 40 in FIG. 6 includes a protective layer 42 formed of Ni or Ni alloy and an outermost layer 43, which are sequentially stacked on a metal substrate 41. In the outermost layer 43, both Pd and Au particles are present as in the lead frame shown in FIG. 5.

In the above embodiments, the metal of the outermost layer is not limited to Pd and Au. For example, silver (Ag) may be used instead of Au.

Figure 7:
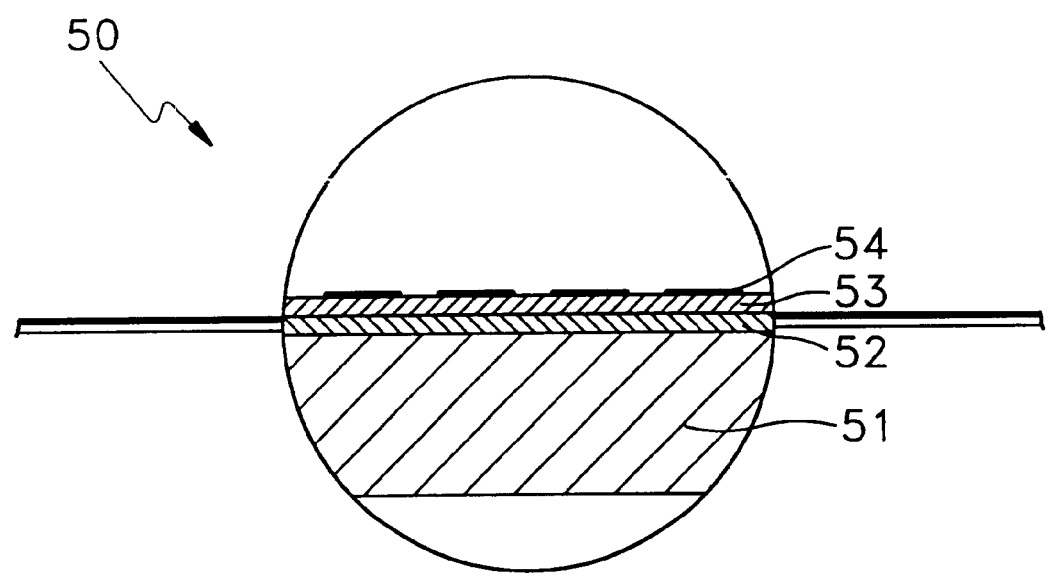
FIG. 7 is a sectional view of another embodiment of the lead frame according to the present invention.
Figure 8:
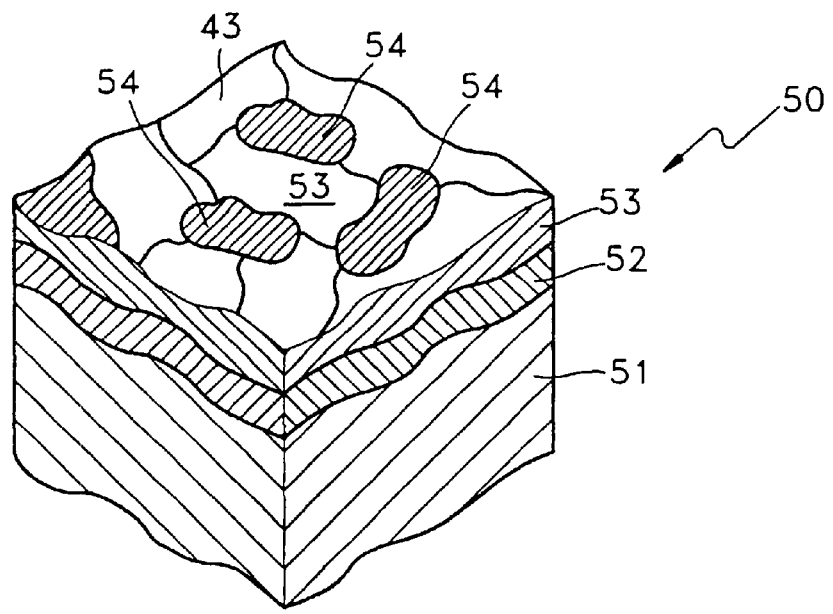
FIG. 8 is a partially enlarged perspective view of the lead frame in FIG. 7.

FIG. 7 shows another example of the lead frame according to the present invention. As shown in FIG. 7, the lead frame 50 has a protective layer 52 formed of Ni or Ni alloy on a metal substrate 51. An intermediate layer 53 is formed of Pd or Pd alloy on the protective layer 52. Plated regions 54 having a small thickness are locally formed over the intermediate layer 53 with Au or Au alloy. The location of the plated regions 54 on the intermediate layer 53 can be seen in FIG. 8. Here, the thickness of the plated regions is equivalent to the height of several atoms. Thus, as shown in FIG. 8, the intermediate layer 53 is locally exposed or occupied by the plated regions 54. Preferably, the Au alloy for the plated regions 54 is Au-Pd or Au-Ag.

Figure 9A:
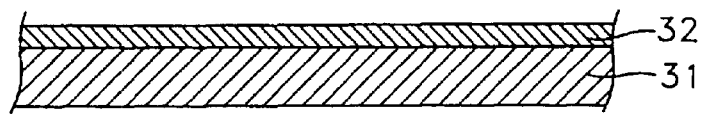
FIGS. 9A through 9C are sectional views illustrating lead frame manufacture according to the present invention.
Figure 9B:
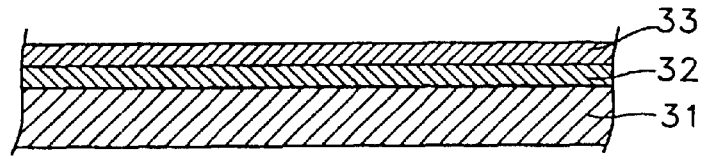
Figure 9C:
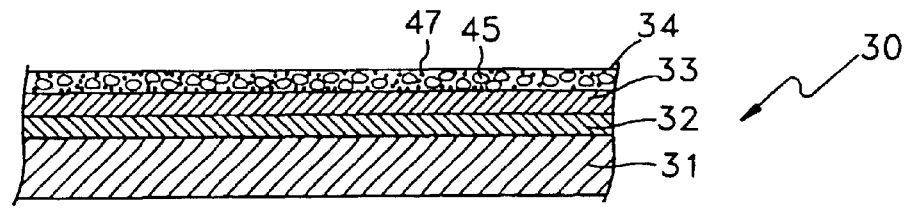

FIGS. 9A through 9C illustrate an embodiment of lead frame manufacture according to the present invention. First, the metal substrate 31 formed of Cu, Cu alloy or Fe alloy is prepared, and the protective layer 32 is formed of Ni or Ni alloy on the metal substrate as shown in FIG. 9A. Then, the intermediate layer 33 is formed of Pd or Pd alloy on the protective layer 32 as shown in FIG. 9B. The protective layer 32 and the intermediate layer 33 can be plated by applying pulse current, or by sputtering or vacuum deposition. Then, the outermost layer 34 where Pd and Au particles 47 coexist is formed on the intermediate layer 33, completing the lead frame (see FIG. 9C). The outermost layer 34 is formed by the plating with application of pulse current. In other words, palladium is accumulated only at nucleation sites on the protective layer 32 by adjusting current density and plating time, resulting in palladium spots 45 on the surface of the intermediate layer 33.

In turn, Au is accumulated filling the space between deposited Pd particles on the intermediate layer 33. The Au deposition potential which is lower than the Pd deposition potential allows easy electroplating of Au between Pd particles. After the electroplating with Au is completed, Pd is accumulated again to fill porosities or micro cracks which may present between the Au and Pd particles and cause unstable lead frame, resulting in the outermost layer 34 on the intermediate layer 33.

Instead of forming the outermost "layer" on the intermediate layer, as shown in FIG. 8, the plated "regions" 54 that are scattered on the intermediate layer 53 can be formed by plating with Au or Au alloy.

As described above, the outermost layer 34 of the lead frame according to the present invention can be formed by alternately accumulating Pd and Au by plating. During electroplating of the outermost layer formation, a pulse current is applied. The rectangular waveform of the pulse current may be a series of positive pulses separated by a predetermined interval. The waveform of the current may also alternate between positive and negative pulses. There may also be a predetermined interval between the positive and negative pulses. Additionally, the waveform of the current may alternate between positive and negative pulses, wherein each of the positive and negative pulses are modulated by a small pulse train.

Also, the lead frame 50 as shown in FIG. 8 is formed by high pulse application so as to improve evenness of the intermediate layer 53 made of Pd or Pd alloy. Also, the formation of the plated regions 54 with Au or Au alloy on the surface of the intermediate layer 53 can be achieved by the high-pulse application, sputtering or deposition.

In semiconductor package manufacture using the lead frame according to the present invention, diffusion of Ni out of the protective layer 32, which is formed of Ni or Ni alloy, toward the outermost layer 34 of the lead frame during a thermal process can be prevented by the intermediate layer 33. Thus, oxidation or corrosion of the lead frame can be avoided.

The outermost layer 34 on the intermediate layer 33 or the surface of the intermediate layer 53 having the plated regions 54 includes both Pd and Au particles having good wire bonding properties. Also, the presence of Au decreases the area of the outermost layer occupied by Pd that is subjected to oxidation. Accordingly, the conventional problems can be eliminated. In addition, since the oxidation of Pd occurs after the wire bonding, the adhesion of the outermost layer 34 with mold resin is improved. Also, the alternated plating with Pd and Au allows the intermediate layer 33 having an improved protective function, by eliminating perforations due to hydrogen bubbles. Also, the interaction between Pd and Au in the outermost layer 34 improves the solderability and wire bonding properties compared to the case of forming the outermost layer exclusively including Au. Furthermore, since the Au or Au alloy layer is formed as thin as possible, the amount of expensive Au used can be reduced, lowering the manufacturing cost.

The effect of the lead frame according to the present invention will be thorough and complete by the following examples.

EXAMPLE 1

For a lead frame according to the present invention, a Pd intermediate layer was formed to have a thickness of 0.2 microinch and an outermost layer including both Pd and Au particles was formed on the Pd intermediate layer. Also, a lead frame having a Au outermost layer on the Pd intermediate layer was manufactured for Comparative Example 1, a lead frame having no outermost layer on the Pd plated layer was manufactured for Comparative Example 2, a lead frame having a Pd—Au plated layer on the Pd intermediate layer was manufactured for Comparative Example 3.

For a solderability test, the lead frame was baked at 250° C. for 5 minutes and cured at 270° C. for 1 hour. After bending leads of the frame, the lead frame was exposed to curing at 175° C. for 1 hour, and in turn steam aging at 95° C. for 8 hours. For a wire bonding test, a Au wire having a diameter of 1 mil was used. The bonding power and bonding force applied at the chip mounted on the pad and at the inner lead were 90 mW and 100 mN. The bonding period of time was 15 msec and 20 msec with respect to the chip on the pad and the inner lead, respectively. Then, the tension force of the Au wire bonded across the chip and the inner lead was measured.

The results of the solderability and wire bonding tests are shown in Table 1.

TABLE 1

| Items | Comparative Example 1 | Comparative Example 2 | Comparative Example 3 | Present Invention |
|---|---|---|---|---|
| Number of layers | 3L | 2L | 3L | 2.5L |
| Solderability (%) | 20–30 | 20–30 | 20–30 | 90–95 |
| Wire bonding strength (gf) | 3.36 | 2.38 | 3.75 | 5.83 |

Table 1 shows that both the solderability and wire bonding strength are improved for the lead frame according to the present invention.

EXAMPLE 2

For a lead frame according to the present invention, a Pd intermediate layer was formed to have a thickness of 0.2 microinch and an outermost layer including both Pd and Au particles was formed on the Pd intermediate layer 0.2-microinch thick. Also, a lead frame having a Au outermost layer on a Pd intermediate layer having a thickness of 0.8 microinch was manufactured for Comparative Example 1, and a lead frame having no outermost layer on a Pd plated layer having a thickness of 0.2 microinch was manufactured for Comparative Example 2.

For a solderability test, the lead frame was baked at 360° C. for 1 minutes. For a wire bonding test, a Au wire having a diameter of 1 mil was used. The bonding power and bonding force applied at the chip mounted on the pad and at the inner lead were 90 mW and 100 mN. The bonding period of time was 15 msec and 20 msec with respect to the chip on the pad and the inner lead, respectively. Then, the tension force of the Au wire bonded across the chip and the inner lead was measured.

The results of the solderability and wire bonding tests are shown in Table 2.

TABLE 2

| Items | Comparative Example 1 | Comparative Example 2 | Present Invention |
|---|---|---|---|
| Number of layers | 3L | 2L | 2.5L |
| Solderability (%) | 85–95 | 60–80 | 100 |
| Minimum wire bonding strength (gf) | 2.65 | 0.91 | 7.03 |
| Maximum wire bonding strength (gf) | 7.58 | 6.86 | 9.64 |
| Average wire bonding strength (gf) | 4.73 | 3.55 | 8.81 |

As can be seen from Table 2, the solderability and the wire bonding strength were improved for the lead frame according to the present invention.

EXAMPLE 3

The adhesion between the outermost layer and resin was measured for the lead frames manufactured in Example 1. For the adhesion test, two commercially available thermo-curable resins (SL7300 and T16BC) were used to mold the lead frame. The result is shown in FIG. 10.

Figure 10:
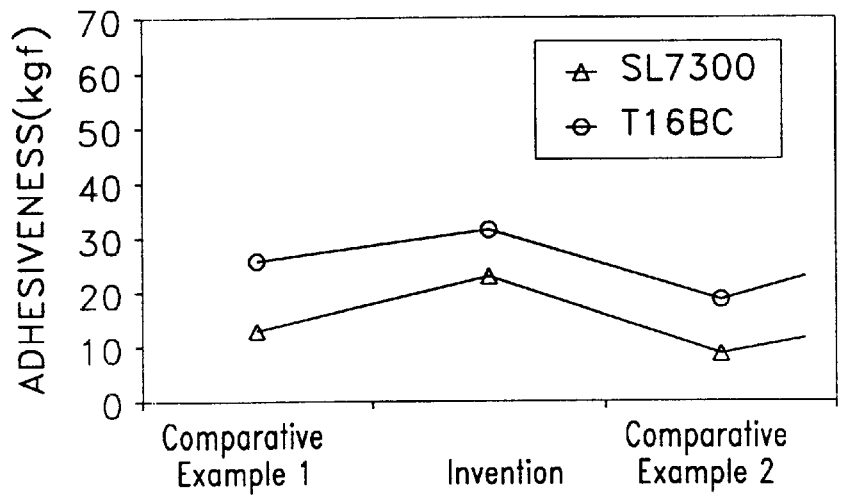
FIG. 10 is a graph showing the adhesion with resins for a lead frame according to the present invention and for Comparative Examples.

As shown in FIG. 10, the adhesion force between the outermost layer and rein is maximum with respect to the lead frame having the Pd—Au outermost layer on the Pd intermediate layer for both two resins.

EXAMPLE 4

For a lead frame according to the present invention, a Ni protective layer was formed on a metal substrate formed of Cu to have a thickness of 30 microinch, and a Pd intermediate layer was formed on the Ni protective layer to have a thickness of 0.8 microinch. In turn, plated regions formed of Au or Au alloy were formed being scattered on the Pd intermediate layer to have a thickness of about 0.03 microinch.

For Comparative Example 1, 0.3 microinch-thick plate regions were formed of Au or Au alloy on a general PPF lead frame. For Comparative Example 2, a lead frame having a 30 microinch-thick Ni protective layer and a 1.0 microinch-thick Pd intermediate layer, with no plated regions, was manufactured.

For a solderability test, the lead frame was cured at 275° C. for 1 hours in an oven. After bending leads of the frame, the lead frame was exposed to curing at 175° C. for 2 hours, and in turn steam aging at 95° C. for 8 hours. For a wire bonding test, a Au wire having a diameter of 1 mil was used. The bonding power and bonding force applied at the chip mounted on the pad and at the inner lead of the frame were 90 mW and 100 mN. The bonding period of time was 15 msec and 20 msec with respect to the chip on the pad and the inner lead, respectively, and the bonding temperature was 215° C. Then, the tension force of the Au wire bonded across the chip and the inner lead was measured.

In the solderability test, the outer lead of the frame was immersed in an R flux at 245° C. for 5 seconds and drawn out of the flux, and an area of the outer lead with the flux with respect to the total area of the outer lead is shown by percentage.

Figure 11:
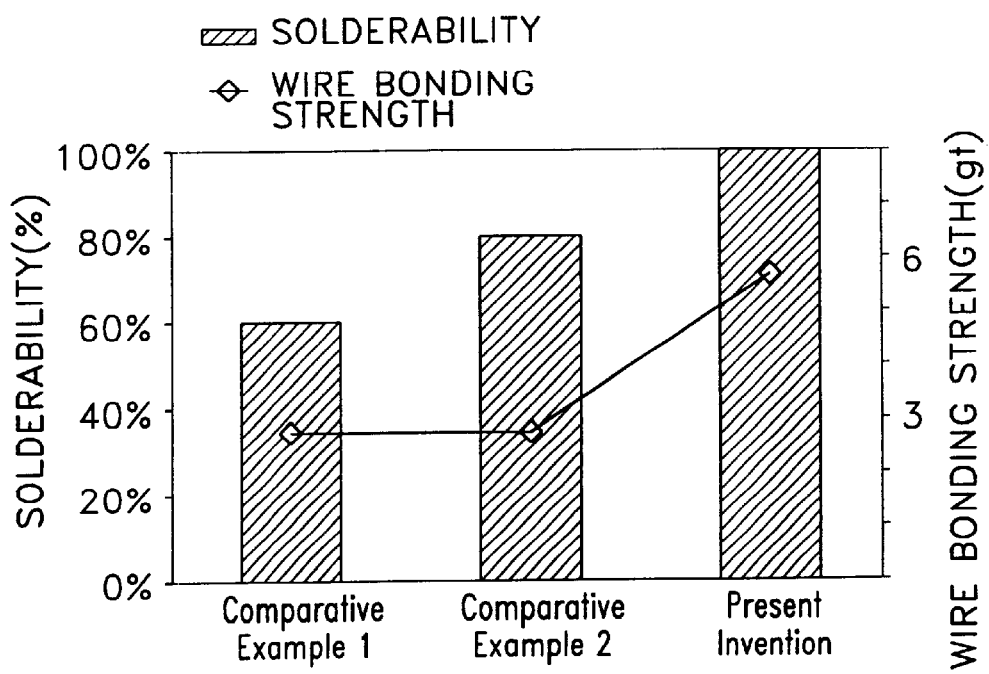
FIG. 11 is a graph showing the solderability of a lead frame according to the present invention and Comparative Examples.

The results of the solderability and wire bonding tests are shown in FIG. 11.

In FIG. 11, the hatching bars represent the result of the solderability test, and the plot represents the result of the wire bonding test. The solderability and the wire bonding strength for Comparative Example 1 are 60% and 2.69 gf, respectively. The solderability and the wire bonding strength for Comparative Example 2 are 80% and 2.69 gf, respectively. Compared to the solderability and the wire bonding strength for Comparative Examples 1 and 2, those for the lead frame according to the present invention are improved at 100% and 5.91 gf, respectively.

EXAMPLE 5

As the lead pitch of the lead frame and the chip size decrease, the size of capillary used for wire bonding has decreased. In order to keep step with this trend, the wire bonding strength of a lead frame according to the present invention was measured with a reduced bonding power and bonding force.

For the lead frame according to the present invention, a lead frame having plated portions on a Pd intermediate layer having a thickness of 1.0 microinch was manufactured. For Comparative Example, a lead frame having a 1.2 microinch Pd layer as an outermost layer was manufactured. For a wire bonding test, a capillary having a diameter of 80 micrometer, and a Au wire having a diameter of 0.8 mil were used.

The bonding on the chip mounted on the pad of the frame was carried out at a bonding power of 60 mW with a bonding force 60 mN at 200° C. for 15 msec. Meanwhile, the bonding on the inner lead of the frame was carried out at a bonding power of 80 mW with a bonding force 80 mN at 220° C. for 20 msec.

The result of the wire bonding test is shown in Table 3.

TABLE 3

| Items | Present Invention | Comparative Example |
|---|---|---|
| Minimum wire bonding strength (gf) | 3.38 | 1.75 |
| Average wire bonding strength (gf) | 4.57 | 3.59 |
| Maximum wire bonding strength (gf) | 6.75 | 5.01 |

As shown in Table 3, the minimum bonding strength of the lead frame according to the present invention is improved at about 3 gf compared to Comparative example having 1.75 gf wire bonding strength.

The lead frame having multiple plated layers according to the present invention takes the advantages of Au and Pd plated layers, in view of the wire bonding strength, the solderability and the adhesion with resin. In addition to the improvement in those properties, the manufacturing cost of the lead frame according to the present invention can be lowered.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A lead frame for a semiconductor package, comprising:
   a metal substrate;
   a protective layer of nickel (Ni) or Ni alloy on the metal substrate;
   an intermediate layer of palladium (Pd) on the protective layer; and
   an outer layer plated on the intermediate layer, the outer layer including accumulations of Pd particles on the intermediate layer and accumulations of gold (Au) particles in the space between the accumulations of Pd particles.

2. A lead frame for a semiconductor package, comprising:

a metal substrate;

a protective layer of nickel (Ni) or Ni alloy on the metal substrate;

an intermediate layer of palladium (Pd) on the protective layer; and gold (Au) or Au alloy plated regions plated on the intermediate layer to partially expose a surface of the intermediate layer.

3. The lead frame of claim 2, wherein the plated regions have a thickness of 0.03 microinch or less.

4. The lead frame of claim 2, wherein the Au alloy is either Au-Pd alloy or Au-silver (Ag) alloy.

5. The lead frame according to claim 1, wherein the accumulations of Pd particles are spots of Pd on the intermediate layer.

6. A lead frame for a semiconductor package comprising:

a metal substrate;

a protective layer of nickel (Ni) or Ni alloy on the metal substrate; and an outer layer plated on the protective layer, the outer layer including accumulations of palladium (Pd) particles on the protective layer and accumulations of gold (Au) particles in the space between the accumulations of Pd particles.

7. The lead frame according to claim 6, wherein the accumulations of Pd particles are spots of Pd on the protective layer.

* * * * *